(12) United States Patent
Lasiter et al.

(10) Patent No.: US 10,490,880 B2
(45) Date of Patent: Nov. 26, 2019

(54) GLASS-BASED ANTENNA ARRAY PACKAGE

(71) Applicant: QUALCOMM Incorporated, San Diego, CA (US)

(72) Inventors: Jon Bradley Lasiter, Stockton, CA (US); Ravindra Vaman Shenoy, Dublin, CA (US); Donald William Kidwell, Jr., Los Gatos, CA (US); Mohammad Ali Tassoudji, San Diego, CA (US); Mario Francisco Velez, San Diego, CA (US)

(73) Assignee: QUALCOMM Incorporation, San Diego, CA (US)

( * ) Notice: Subject to any disclaimer, the term of this patent is extended or adjusted under 35 U.S.C. 154(b) by 0 days.

(21) Appl. No.: 15/708,084

(22) Filed: Sep. 18, 2017

(65) Prior Publication Data

US 2018/0342788 A1 Nov. 29, 2018

Related U.S. Application Data

(60) Provisional application No. 62/511,943, filed on May 26, 2017.

(51) Int. Cl.

| H01Q 1/22 | (2006.01) |
| H01Q 1/38 | (2006.01) |
| H01Q 1/46 | (2006.01) |
| H05K 3/30 | (2006.01) |
| H01L 21/02 | (2006.01) |
| H01Q 21/00 | (2006.01) |

(Continued)

(52) U.S. Cl.
CPC ..... *H01Q 1/2283* (2013.01); *H01L 21/02518* (2013.01); *H01L 27/14601* (2013.01); *H01Q 1/38* (2013.01); *H01Q 1/46* (2013.01); *H01Q 21/0087* (2013.01); *H05K 3/305* (2013.01); *H01L 2221/00* (2013.01); *H01L 2225/065* (2013.01); *H01Q 21/065* (2013.01)

(58) Field of Classification Search
None
See application file for complete search history.

(56) References Cited

U.S. PATENT DOCUMENTS 7,408,512 B1* 8/2008 Rodenbeck .......... H01Q 1/2208
343/700 MS
8,187,920 B2 5/2012 Mohan et al.
(Continued)

OTHER PUBLICATIONS

Shi T., et al., "First Demonstration of Panel Glass Fan-out (GFO) Packages for High I/O Density and High Frequency Multi-Chip Integration", 2017 IEEE 67th Electronic Components and Technology Conference, 2017, pp. 41-46.

*Primary Examiner* — Howard Williams
(74) *Attorney, Agent, or Firm* — Muncy, Geissler, Olds & Lowe

(57) ABSTRACT

The disclosure relates to a glass-based antenna array package. In an aspect, such a glass-based antenna array package includes a single glass substrate layer, one or more antennas attached to a first side of the glass substrate layer, at least one semiconductor device attached to a second side of the glass substrate layer, and a first photoimageable dielectric layer adhered to the second side of the glass substrate layer and encapsulating the at least one semiconductor device. A method of manufacturing the same is also disclosed.

30 Claims, 5 Drawing Sheets

(51) Int. Cl.
*H01Q 21/06* (2006.01)
*H01L 27/146* (2006.01)

(56) References Cited

U.S. PATENT DOCUMENTS

| | | | |
|---|---|---|---|
| 9,024,429 B2 | 5/2015 | Yap | |
| 9,431,369 B2 | 8/2016 | Chih et al. | |
| 9,461,355 B2 | 10/2016 | Nair et al. | |
| 9,536,845 B2 | 1/2017 | Lamy et al. | |
| 10,103,450 B2 * | 10/2018 | Dang | H01Q 21/0075 |
| 2015/0061139 A1 * | 3/2015 | Yap | H01L 24/26 |
| | | | 257/773 |
| 2016/0071780 A1 * | 3/2016 | Chiu | H01L 23/5226 |
| | | | 257/774 |
| 2016/0322332 A1 * | 11/2016 | Kim | H01L 23/16 |

* cited by examiner

GLASS-BASED ANTENNA ARRAY PACKAGE

CROSS-REFERENCE TO RELATED APPLICATIONS

The present application for patent claims the benefit of U.S. Provisional Application No. 62/511,943, entitled "GLASS-BASED ANTENNA ARRAY PACKAGE," filed May 26, 2017, assigned to the assignee hereof, and expressly incorporated herein by reference in its entirety.

INTRODUCTION

Aspects of this disclosure relate generally to telecommunications, and more particularly to a glass-based antenna array package and the like.

Wireless communication systems have developed through various generations, including a first-generation analog wireless phone service (1G), a second-generation (2G) digital wireless phone service (including interim 2.5G and 2.75G networks), a third-generation (3G) high speed data, Internet-capable wireless service and a fourth-generation (4G) service (e.g., LTE or WiMax). There are presently many different types of wireless communication systems in use, including Cellular and Personal Communications Service (PCS) systems. Examples of known cellular systems include the cellular Analog Advanced Mobile Phone System (AMPS), and digital cellular systems based on Code Division Multiple Access (CDMA), Frequency Division Multiple Access (FDMA), Time Division Multiple Access (TDMA), the Global System for Mobile access (GSM) variation of TDMA, etc.

A fifth generation (5G) mobile standard calls for higher data transfer speeds, greater numbers of connections, and better coverage, among other improvements. The 5G standard, according to the Next Generation Mobile Networks Alliance, is designed to provide data rates of several tens of megabits per second to each of tens of thousands of users, and one gigabit per second to tens of workers on an office floor. Several hundreds of thousands of simultaneous connections should be supported in order to support large sensor deployments. Consequently, the spectral efficiency of 5G mobile communications should be significantly enhanced compared to the current 4G standard. Furthermore, signaling efficiencies should be enhanced and latency should be substantially reduced compared to current standards.

To address at least some of these goals, various 5G devices utilize beam-forming antennas that can send and receive mobile data faster than one gigabit per second over distances as great as two kilometers. Such antennas are designed to operate at or near "millimeter-wave" frequencies (e.g., three to 300 gigahertz). Cellular networks have previously occupied bands lower on the spectrum, where carrier waves are tens of centimeters long (e.g., hundreds of megahertz).

Using millimeter-waves for mobile coverage has a number of challenges. For example, millimeter-waves do not penetrate solid materials very well and, because they are readily absorbed or scattered by gases, rain, and foliage, for example, they tend to lose more energy over longer distances than do lower frequencies. In addition, because a single millimeter-wave antenna has a small aperture, it needs more power to send and receive data than is practical for cellular systems. To address these issues, current millimeter-wave antenna packages use an array of multiple antennas to concentrate radio energy in a narrow, directional beam, thereby increasing gain without increasing transmission power. However, fabricating such antenna packages is difficult and expensive, and as such, it would be beneficial to reduce the cost and complexity of manufacturing millimeter-wave antenna packages.

SUMMARY

The following presents a simplified summary relating to one or more aspects disclosed herein. As such, the following summary should not be considered an extensive overview relating to all contemplated aspects, nor should the following summary be regarded to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, a glass-based antenna array package includes a single glass substrate layer, one or more antennas attached to a first side of the glass substrate layer, at least one semiconductor device attached to a second side of the glass substrate layer, and a photoimageable dielectric layer adhered to the second side of the glass substrate layer and encapsulating the at least one semiconductor device.

In an aspect, a method of manufacturing a glass-based antenna array package includes providing a single glass substrate layer, attaching one or more antennas to a first side of the glass substrate layer, attaching at least one semiconductor device to a second side of the glass substrate layer, and adhering a photoimageable dielectric layer to the second side of the glass substrate layer, the photoimageable dielectric layer encapsulating the at least one semiconductor device.

In an aspect, a glass-based antenna array package includes a single glass substrate layer, one or more antennas attached to a first side of the glass substrate layer, at least one means for processing attached to a second side of the glass substrate layer, and a photoimageable means adhered to the second side of the glass substrate layer and encapsulating the at least one means for processing.

In an aspect, a non-transitory computer-readable medium storing computer-executable instructions for manufacturing a glass-based antenna array package includes computer-executable instructions comprising at least one instruction instructing a machine to provide a single glass substrate layer, at least one instruction instructing a machine to attach one or more antennas to a first side of the glass substrate layer, at least one instruction instructing a machine to attach at least one semiconductor device to a second side of the glass substrate layer, and at least one instruction instructing a machine to adhere a photoimageable dielectric layer to the second side of the glass substrate layer, the photoimageable dielectric layer encapsulating the at least one semiconductor device.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and are provided solely for illustration of the aspects and not limitation thereof.

DETAILED DESCRIPTION

The disclosure relates to a glass-based antenna array package. In an aspect, such a glass-based antenna array package includes a single glass substrate layer, one or more antennas attached to a first side of the glass substrate layer, at least one semiconductor device attached to a second side of the glass substrate layer, and a photoimageable dielectric layer adhered to the second side of the glass substrate layer and encapsulating the at least one semiconductor device. A method of manufacturing the same is also disclosed.

These and other aspects of the disclosure are provided in the following description and related drawings directed to various examples provided for illustration purposes. Alternate aspects may be devised without departing from the scope of the disclosure. Additionally, well-known aspects of the disclosure may not be described in detail or may be omitted so as not to obscure more relevant details.

Figure 1:
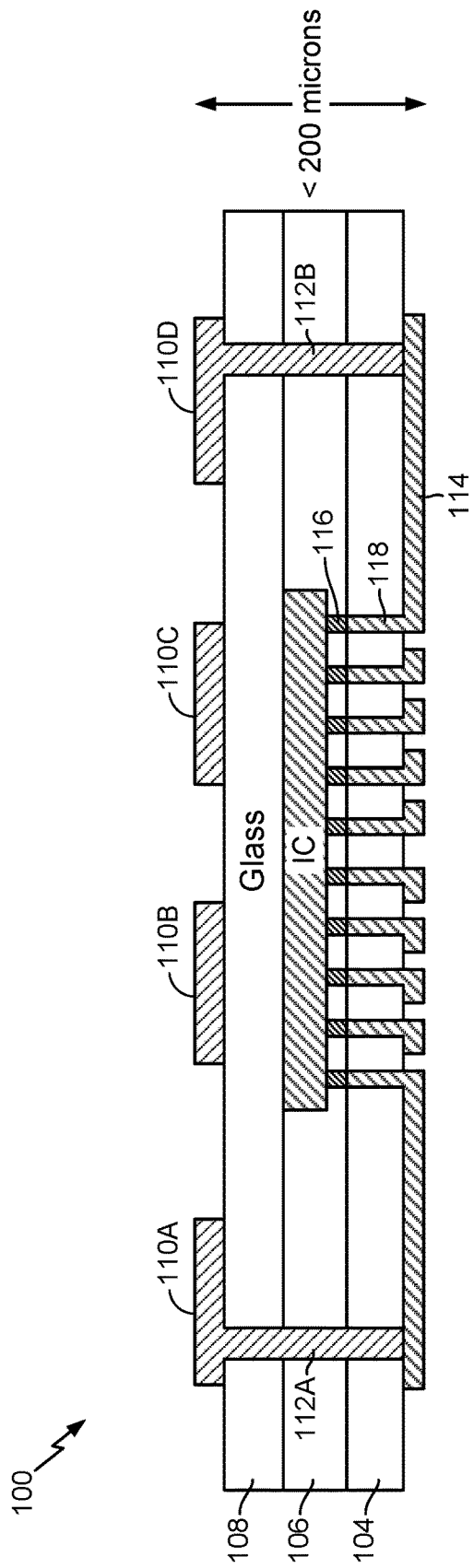
FIG. 1 illustrates a conventional millimeter-wave antenna package utilizing two glass substrates.

FIG. 1 illustrates a conventional millimeter-wave antenna package 100 utilizing two glass substrate layers. The millimeter-wave antenna package 100 includes a semiconductor device 102 (illustrated as an integrated circuit (IC) in FIG. 1) mounted to a dielectric layer 104. A first glass substrate layer 106 laminated to the dielectric layer 104 encapsulates the semiconductor device 102. A second glass substrate layer 108 is laminated to the first glass substrate layer 106 to give the millimeter-wave antenna package 100 rigidity. A plurality of antennas 110A-D is attached to the surface of the glass substrate layer 108. Note that although FIG. 1 illustrates four antennas 110A-D, there may be more or fewer than four antennas. Two vias 112A and 112B are illustrated as connecting antennas 110A and 110D to a conductive redistribution layer 114 through the glass substrate layers 106 and 108 and the dielectric layer 104. Although only two vias 112A and 112B are shown in FIG. 1, as will be appreciated, each antenna 110A-110D is coupled to the conductive redistribution layer 114 by a via through the glass substrate layers 106 and 108 and the dielectric layer 104. The semiconductor device 102 is coupled to the conductive redistribution layer 114 by a plurality of interconnects 116 coupled to a corresponding plurality of interconnect vias 118 through the dielectric layer 104.

The dielectric layer 104 may be one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), hafnium oxide ($HfO_2$), benzocyclobutene (BCB), polyimide (PI), polybenzoxazoles (PBO), or other material having similar insulating and structural properties, as is known in the art. The conductive layers (e.g., vias 112A and 112B, the conductive redistribution layer 114, the plurality of interconnects 116, the plurality of interconnect vias 118, etc.) may be one or more layers of aluminum (Al), copper (Cu), tin (Sn), nickel (Ni), gold (Au), silver (Ag), or other suitable electrically conductive material, as is known in the art. The semiconductor device 102 may be an integrated circuit (IC), a digital signal processor (DSP), an application specific integrated circuit (ASIC), a field programmable gate array (FPGA), or other programmable logic device.

As illustrated in FIG. 1, the millimeter-wave antenna package 100 uses two glass substrate layers 106 and 108. The glass substrate layer 108 is the base substrate (approximately 50 μm thick) and gives the millimeter-wave antenna package 100 rigidity. The glass substrate layer 106 has holes, or recesses, cut into it so that the semiconductor device 102 can be recessed into the glass substrate layer 106.

A benefit of using the two glass substrate layers 106 and 108 in the millimeter-wave antenna package 100 is that the surface of a glass substrate can be etched with very fine lines. In addition, glass has a lower dielectric constant. As such, the two glass substrate layers 106 and 108 can be scaled to a finer geometry. However, using two glass substrate layers adds cost and reliability issues with respect to bonding them to each other and to the other layers of the millimeter-wave antenna package 100. For example, this arrangement necessitates drilling vias (e.g., vias 112A and 112B) through two layers of glass (e.g., glass substrate layers 106 and 108) and the dielectric layer (e.g., dielectric layer 104) after they have been bonded (e.g., laminated) to each other. Due to the heat generated by drilling the vias, delamination can occur at the substrate-to-substrate boundary (e.g., the boundary between the glass substrate layer 106 and the glass substrate layer 108) and the dielectric-to-glass boundary (e.g., the boundary between the dielectric layer 104 and the glass substrate layer 106). Another drawback is that there is also a mismatch between the coefficient of thermal expansion (CTE) of the glass substrate layers 106 and 108 (approximately 3 ppm/C) and the semiconductor device 102 (e.g., approximately 18 ppm/C).

Accordingly, the present disclosure provides a low-cost millimeter-wave antenna package that utilizes a single glass substrate layer. As will be discussed in greater detail below, instead of two glass substrate layers, as in the millimeter-wave antenna package 100, the semiconductor device is mounted to a single glass substrate layer, and a photoimageable dielectric layer encapsulates the semiconductor device instead of a second glass substrate layer (e.g., the glass substrate 106 in FIG. 1). This provides a three dimensional implementation without the cost of through-silicon vias (TSVs), such as vias 112A and 112B in FIG. 1, and without the cost of the second glass substrate layer. In an aspect, such a millimeter-wave antenna package may be integrated into a Radio Frequency Integrated Circuit (RFIC) package.

Figure 2:
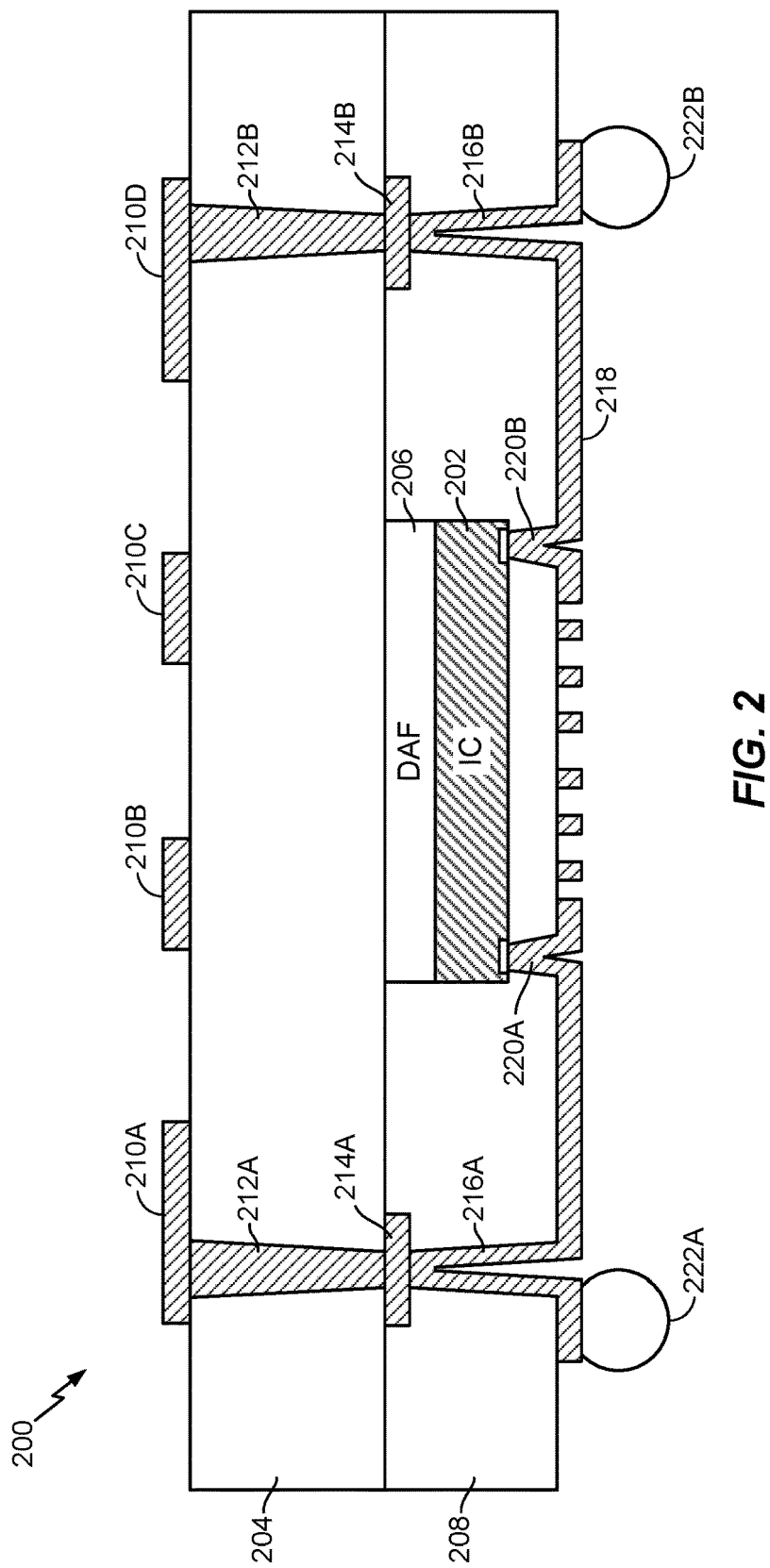
FIG. 2 illustrates an exemplary millimeter-wave antenna package according to at least one aspect of the disclosure.

FIG. 2 illustrates an exemplary millimeter-wave antenna package 200 according to at least one aspect of the disclosure. The millimeter-wave antenna package 200 includes a semiconductor device 202 (illustrated as an "IC" in FIG. 2) mounted to a single glass substrate layer 204 by a die attach film (DAF) 206. Instead of a second glass substrate layer (e.g., glass substrate layer 106 in FIG. 1, a photoimageable dielectric layer 208 is layered over (e.g., adhered to) the glass substrate layer 204 and encapsulates the semiconductor device 202. In the example of FIG. 2, an antenna array of four antennas 210A-210D is attached to the surface of the glass substrate layer 204. Note that although FIG. 2 illustrates four antennas 210A-210D in the antenna array, there may be more or fewer than four antennas 210A-210D. As illustrated in FIG. 2, two though-glass vias (TGVs) 212A and 212B through the glass substrate layer 204 connect antennas 210A and 210D to conductive traces 214A and 214B, respectively, on the surface of the glass substrate layer 204. In the example of FIG. 2, TGVs 212A and 212B are illustrated as filled vias; however, as will be appreciated, they may instead be plated vias. Additionally, although only two TGVs 212A and 212B are shown in FIG. 2, as will be appreciated, each antenna 210A-210D is coupled to a conductive trace on the surface of the glass substrate layer 204 by a TGV though the glass substrate layer 204.

The millimeter-wave antenna package 200 further includes a conductive redistribution layer 218 that provides the "fan-out" connections for the semiconductor device 202. In the example of FIG. 2, the conductive redistribution layer 218 includes two vias 216A and 216B through the photoimageable dielectric layer 208 to the conductive traces 214A and 214B, respectively, and two interconnect vias 220A and 220B through the photoimageable dielectric layer 208 to the interconnects on the semiconductor device 202. In FIG. 2, vias 216A, 216B, 220A, and 220B are illustrated as plated vias; however, as will be appreciated, they may instead be filled vias. In addition, although only two vias 216A and 216B are shown in FIG. 2, as will be appreciated, each antenna 210A-210D is coupled to the conductive redistribution layer 218 by a via through the photoimageable dielectric layer 208. Further, there may be more or fewer than two interconnect vias 220A and 220B connecting the semiconductor device 202 to the conductive redistribution layer 218.

The millimeter-wave antenna package 200 further includes package balls 222A and 222B attached to the conductive redistribution layer 218. Note that while only two package balls 222A and 222B are shown in FIG. 2, as will be appreciated, there may be more or fewer than two package balls.

The conductive layers (e.g., vias 212A, 212B, 216A, 216B, 220A, and 220B, the conductive redistribution layer 218, the conductive traces 214A and 214B, semiconductor device 202 interconnects, etc.) may be one or more layers of Al, Cu, Sn, Ni, Au, Ag, or other suitable electrically conductive material, as is known in the art. The package balls 222A and 222B may be Al, Cu, Sn, Ni, Au, Ag, lead (Pb), bismuth (Bi), solder, or combinations thereof, with an optional flux solution, as is known in the art. The semiconductor device 202 may be an IC, a DSP, an ASIC, a FPGA, or other programmable logic device. In an aspect, the photoimageable dielectric layer 208 may be one or more self planarizing, photo-definable, dielectric layers, such as one or more layers of a polymer having a low dielectric constant (k). The antennas 210A-210D may be millimeter-wave antennas.

In an aspect, the conductive redistribution layer 218 may be 3 to 10 μm thick, the glass substrate layer 204 may be at least approximately 100 μm thick, and the photoimageable dielectric layer 208 may have a total thickness of 10 to 50 μm. The smooth surface of the photoimageable dielectric layer 208 may reduce signal line loss by up to 50%, may permit smaller vias than that of direct laser writing, and provide a compliant CTE buffer to the glass substrate layer 204.

Note that while FIG. 2 illustrates a single semiconductor device 202, there may be a plurality of semiconductor devices attached to the glass substrate layer 204 and encapsulated by the photoimageable dielectric layer 208. In addition, there may be one or more passive devices (e.g., radio frequency identifier (RFID) chips) attached to the glass substrate layer 204 and encapsulated by the photoimageable dielectric layer 208.

There are a number of benefits to using a photoimageable dielectric layer (e.g., photoimageable dielectric layer 208) instead of a second glass substrate layer (e.g., glass substrate layer 106). For example, eliminating the second glass substrate layer eliminates the need to laser drill the vias through multiple glass substrate layers after bonding. In addition, using a photoimageable dielectric layer instead of a second glass substrate layer takes advantage of economies of scale: a larger number of die can be produced utilizing lower cost infrastructure. Further, using a photoimageable dielectric layer as the encapsulating layer permits low cost heterogeneous integration. For example, the photoimageable dielectric layer allows for multiple semiconductor devices of different nodes, multiple dies of various materials, surface-mount technology (SMT) components, tunable components, microelectromechanical systems (MEMS) components, etc., to be attached to the substrate (e.g., glass substrate layer 204). In addition, passive on glass (POG) devices (e.g., inductors, capacitors, resistors, etc.) can be integrated on or into the glass substrate layer (e.g., glass substrate layer 204), which reduces the cost and lowers the loss of such POG devices. Moreover, such POG devices can have a higher quality factor (Q) than those fabricated on the semiconductor device 202.

FIGS. 3A-3E illustrate an exemplary process of manufacturing the millimeter-wave antenna package 200 illustrated in FIG. 2 according to at least one aspect of the disclosure. In the operation illustrated in FIG. 3A, the TGVs 212A and 212B are formed (e.g., laser drilled and filled or plated with conductive material) in the glass substrate layer 204. In the operation illustrated in FIG. 3B, the array of antennas 210A-210D is attached to the glass substrate layer 204 and the conductive traces 214A and 214B are plated on the glass substrate layer 204. In the operation illustrated in FIG. 3C, the semiconductor device 202 is attached to the glass substrate layer 204 using the DAF 206. Note that this is in contrast to the millimeter-wave antenna package 100 illustrated in FIG. 1, where the semiconductor device 102 is attached to the dielectric layer 104.

Figure 3A:
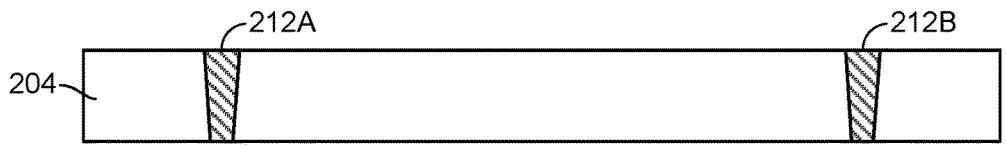
FIGS. 3A-3E illustrate an exemplary process of manufacturing the millimeter-wave antenna package illustrated in FIG. 2 according to at least one aspect of the disclosure.
Figure 3B:
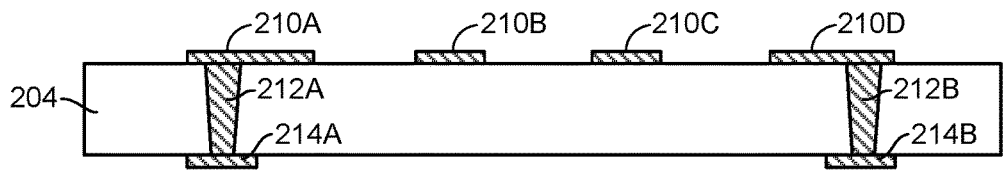
Figure 3C:
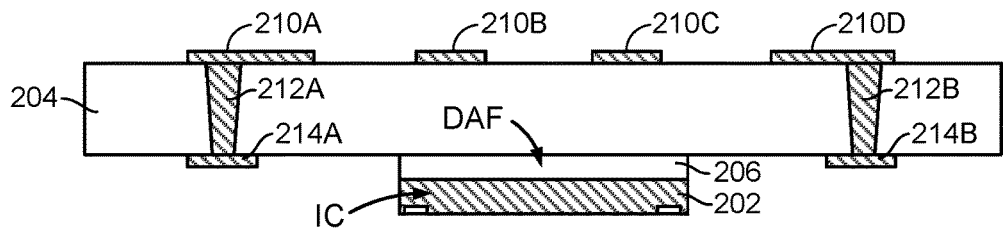
Figure 3D:
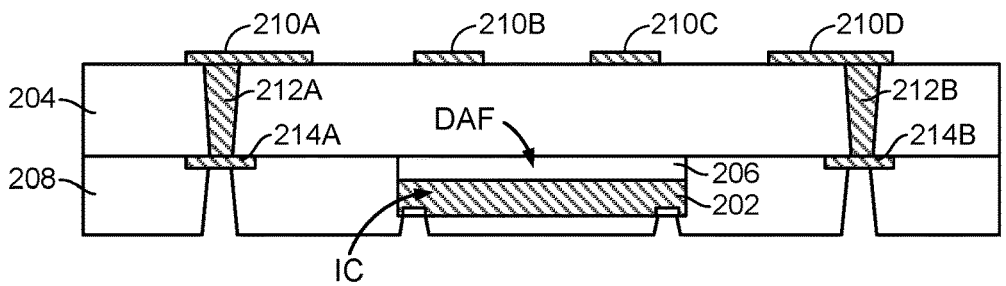
Figure 3E:
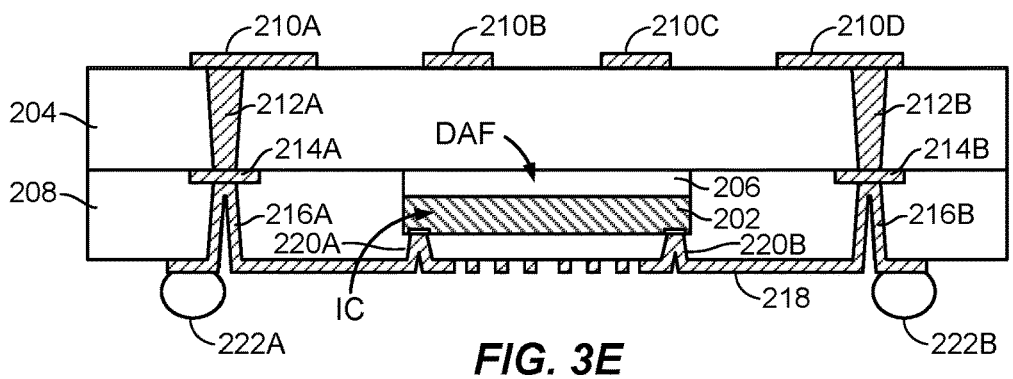

In the operation illustrated in FIG. 3D, the photoimageable dielectric layer 208 is layered over (e.g., adhered to) the glass substrate layer 204 to encapsulate the semiconductor device 202 and the conductive traces 214A and 214B. The one or more layers of the photoimageable dielectric layer 208 may be applied using a variety of suitable techniques, such as spin coating or spray coating. Openings in the photoimageable dielectric layer 208 for the vias 216A, 216B, 220A, and 220B are then made by photolithography. In the operation illustrated in FIG. 3E, the conductive redistribution layer 218 is applied on the photoimageable dielectric layer 208 using a semi-additive plating process. As part of applying the conductive redistribution layer 218, the vias 216A, 216B, 220A, and 220B are plated (and/or filled). Also during this operation, the package balls 222A and 222B are attached to the conductive redistribution layer 218.

FIGS. 4A-4E illustrate an exemplary process of manufacturing the millimeter-wave antenna package 200 illustrated in FIG. 2 according to at least one aspect of the disclosure. In the operation illustrated in FIG. 4A, like the operation illustrated in FIG. 3A, the TGVs 212A and 212B are formed (e.g., laser drilled and filled or plated with conductive material) in the glass substrate layer 204. In the operation illustrated in FIG. 4B, like the operation illustrated in FIG. 3B, the array of antennas 210A-210D is attached to the glass substrate layer 204 and the conductive traces 214A and 214B are plated on the glass substrate layer 204. In the operation illustrated in FIG. 4C, like the operation illustrated in FIG. 3C, the semiconductor device 202 is attached to the glass substrate layer 204 using the DAF 206.

Figure 4A:
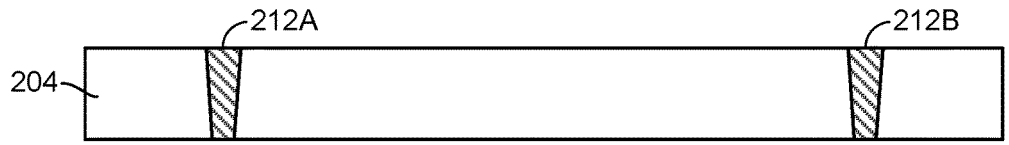
FIGS. 4A-4E illustrate an exemplary process of manufacturing the millimeter-wave antenna package illustrated in FIG. 2 according to at least one aspect of the disclosure.
Figure 4B:
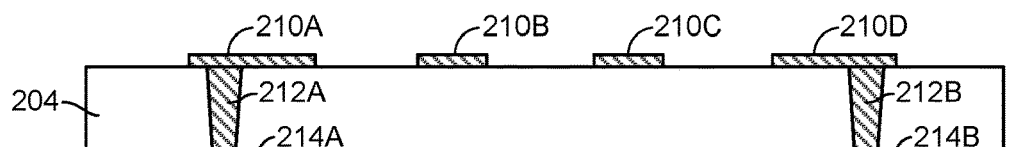
Figure 4C:
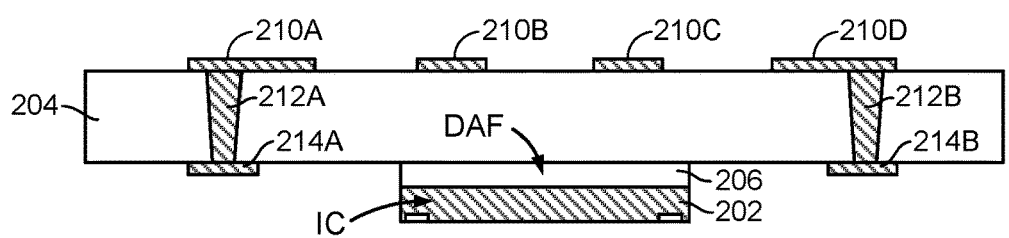
Figure 4D:
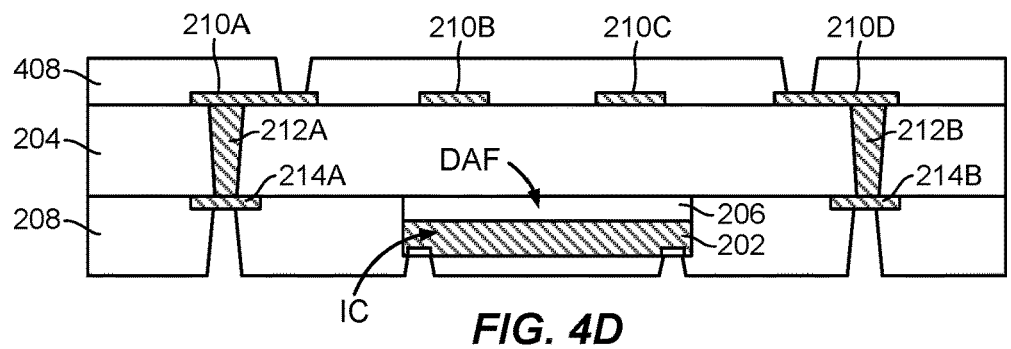

In the operation illustrated in FIG. 4D, the photoimageable dielectric layer 208 is layered over (e.g., adhered to) the glass substrate layer 204 to encapsulate the semiconductor device 202 and the conductive traces 214A and 214B. In addition, a second photoimageable dielectric layer 408 is layered over the array of antennas 210A-210D. The one or more layers of the photoimageable dielectric layers 208 and 408 may be applied using a variety of suitable techniques, such as lamination, spin coating, or spray coating. Openings in the photoimageable dielectric layers 208 and 408 for the vias (e.g., vias 216A, 216B, 220A, and 220B) are then made by photolithography.

Figure 4E:
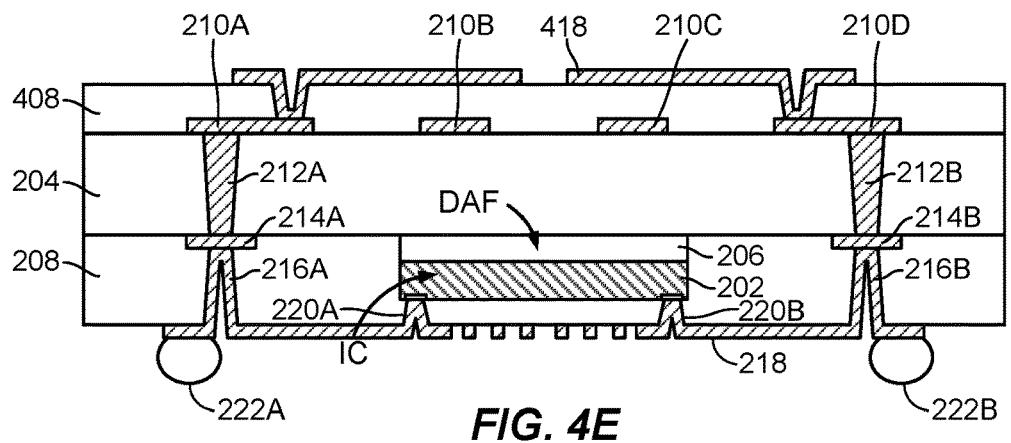

In the operation illustrated in FIG. 4E, the conductive redistribution layer 218 is applied on the photoimageable dielectric layer 208 using a semi-additive plating process. As part of applying the conductive redistribution layer 218, the vias 216A, 216B, 220A, and 220B are plated (and/or filled). Also during this operation, the package balls 222A and 222B are attached to the conductive redistribution layer 218. In addition, a second conductive layer 418 is formed on the photoimageable dielectric layer 408. The conductive layer 418 connects to certain ones of antennas 210A-210D (specifically, antennas 210A and 210D) by a plurality of (plated) vias. The result of the manufacturing process illustrated in FIGS. 4A-4E is the millimeter-wave antenna package 200 with an additional photoimageable dielectric layer 408 and conductive layer 418 stacked thereon, permitting additional components (not shown) to be attached thereto.

As can be seen, in the manufacturing processes illustrated in FIGS. 3A-3E and 4A-4E, using a single glass substrate layer (e.g., glass substrate layer 204) and attaching the semiconductor device(s) (e.g., semiconductor device 202) to the glass substrate layer (e.g., glass substrate layer 204) instead of a dielectric layer (e.g., dielectric layer 104) eliminates the need to drill vias through two glass substrate layers and a dielectric layer after the glass substrate layers and the dielectric layer have been bonded together, in contrast to the millimeter-wave antenna package 100 in FIG. 1.

Figure 5:
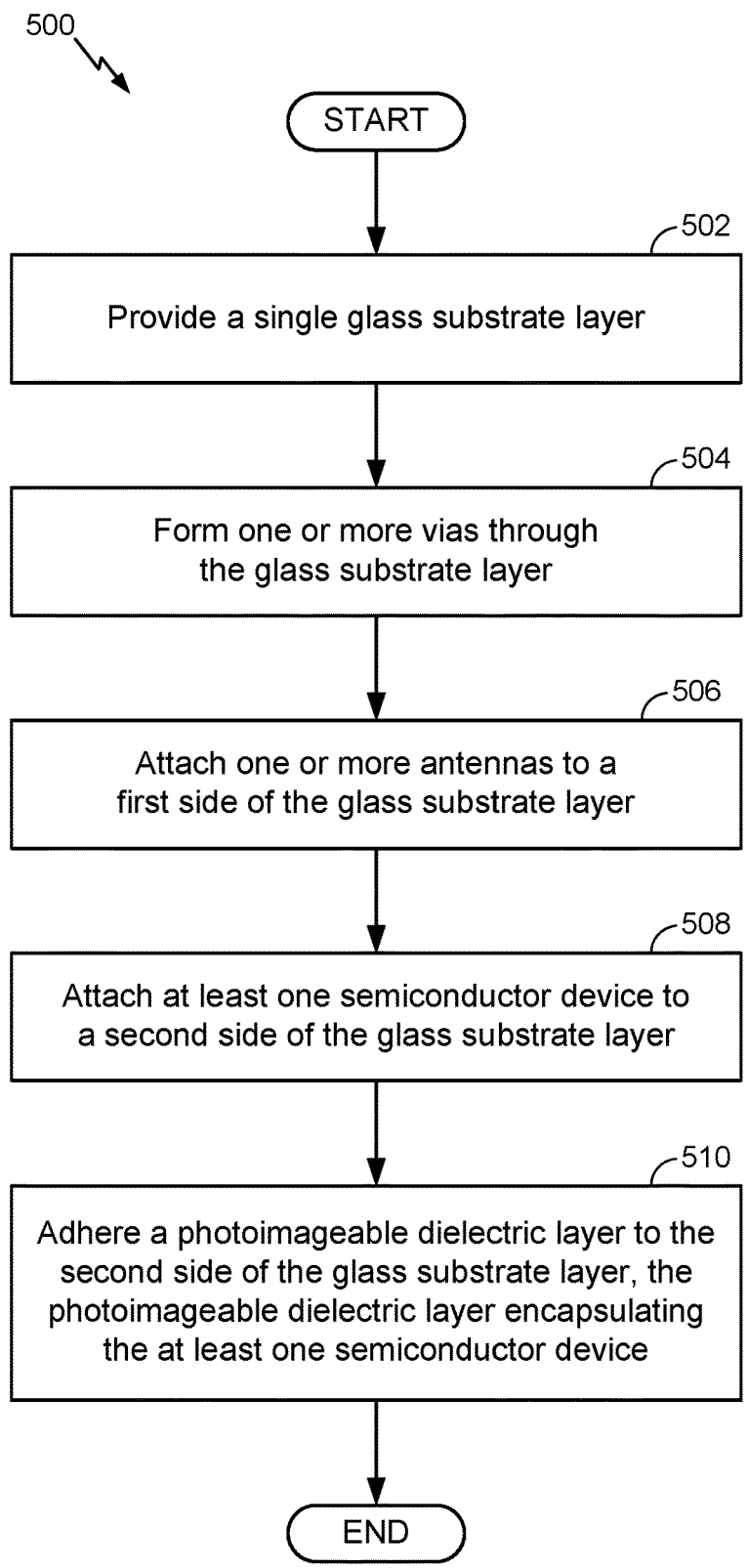
FIG. 5 illustrates an exemplary method for manufacturing a glass-based antenna array package, such as the millimeter-wave antenna package in FIG. 2, according to at least one aspect of the disclosure.

FIG. 5 illustrates an exemplary method 500 for manufacturing a glass-based antenna array package, such as the millimeter-wave antenna package 200 in FIG. 2, according to at least one aspect of the disclosure. The method 500 may be performed by various fabrication machinery, as is known in the art. The fabrication machinery may be programmed to perform the following operations by instructions stored on a non-transitory computer-readable medium.

The method 500 includes providing, at 502, a single glass substrate layer (e.g., glass substrate layer 204) and, at 504, forming one or more vias (e.g., TGVs 212A and 212B) through the glass substrate layer, as illustrated in FIGS. 3A and 4A. The method 500 further includes attaching, at 506, one or more antennas (e.g., antennas 210A-210D) to a first side of the glass substrate layer, as illustrated in FIGS. 3B and 4B. At 508, the method 500 includes attaching at least one semiconductor device (e.g., semiconductor device 202) to a second side of the glass substrate layer, as illustrated in FIGS. 3C and 4C. The one or more vias through the glass substrate layer formed during operation 504 conductively couple the at least one semiconductor device to the one or more antennas. At 510, the method 500 further includes adhering a photoimageable dielectric layer (e.g., photoimageable dielectric layer 208) to the second side of the glass substrate layer, the first photoimageable dielectric layer encapsulating the at least one semiconductor device, as illustrated in FIGS. 3D and 4D.

It should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements. In addition, terminology of the form "at least one of A, B, or C" or "one or more of A, B, or C" or "at least one of the group consisting of A, B, and C" used in the description or the claims means "A or B or C or any combination of these elements." For example, this terminology may include A, or B, or C, or A and B, or A and C, or A and B and C, or 2A, or 2B, or 2C, and so on.

It should also be understood that as used herein, the terms "substantially" and "approximately" are not relative terms of degree, but rather, reflect the reality that, due to tolerances in manufacturing processes, two components may not be exactly the same size or have an exact orientation with respect to each other, or that a given component may not be an exact size. Rather, the terms "substantially" and "approximately" mean that the size, orientation, etc. of the component(s) need only be within some tolerance threshold of the described size, orientation, etc. Thus, for example, when one component is described as being "substantially" above or below another component, it means that the components are aligned vertically within some tolerance threshold. Similarly, as another example, when one component is described as being "approximately" a given size, it means that the component is within a given tolerance threshold of the given size. The tolerance threshold may be determined by the capabilities of the manufacturing process, the requirements of the device and/or the components being manufactured, and the like.

It will be appreciated that even if the terms "substantially" or "approximately" are not used to describe a size, orientation, etc. of component(s), it does not mean that the size, orientation, etc. of the component(s) must be exactly the described size, orientation, etc. Rather, the described size, orientation, etc. need only be within some tolerance threshold of the described size, orientation, etc.

It will be appreciated that various aspects disclosed herein can be described as functional equivalents to the structures, materials and/or devices described and/or recognized by those skilled in the art. For example, in one aspect, a glass-based antenna array package apparatus may comprise a single glass substrate layer, one or more antennas attached to a first side of the glass substrate layer, at least one means for processing (e.g., semiconductor device 202) attached to a second side of the glass substrate layer, and a photoimageable means for insulating (e.g., photoimageable dielectric layer 208) encapsulating the at least one means for processing. It will be appreciated that the aforementioned aspects are merely provided as examples and the various aspects claimed are not limited to the specific references and/or illustrations cited as examples.

While the foregoing disclosure shows various illustrative aspects, it should be noted that various changes and modifications may be made to the illustrated examples without departing from the scope defined by the appended claims.

The present disclosure is not intended to be limited to the specifically illustrated examples alone. For example, unless otherwise noted, the functions, steps, and/or actions of the method claims in accordance with the aspects of the disclosure described herein need not be performed in any particular order. Furthermore, although certain aspects may be described or claimed in the singular, the plural is contemplated unless limitation to the singular is explicitly stated.

What is claimed is:

1. A glass-based antenna array package, comprising:
a single glass substrate layer;
one or more antennas attached to a first side of the glass substrate layer;
at least one semiconductor device attached to a second side of the glass substrate layer;
a first dielectric layer having a first surface adhered to the second side of the glass substrate layer, the first dielectric layer encapsulating the at least one semiconductor device; and
a redistribution layer on a second surface of the first dielectric layer, the redistribution layer conductively coupling the at least one semiconductor device to the one or more antennas.

2. The glass-based antenna array package of claim 1, further comprising:
one or more vias through the glass substrate layer conductively coupling the at least one semiconductor device to the one or more antennas.

3. The glass-based antenna array package of claim 1, further comprising:
a plurality of package balls coupled to the first dielectric layer.

4. The glass-based antenna array package of claim 1, further comprising:
a second semiconductor device coupled to the second side of the glass substrate layer and encapsulated by the first dielectric layer.

5. The glass-based antenna array package of claim 1, further comprising:
a passive device surface mounted to the second side of the glass substrate layer and encapsulated by the first dielectric layer.

6. The glass-based antenna array package of claim 1, wherein the glass substrate layer is at least approximately 100 µm thick.

7. The glass-based antenna array package of claim 1, wherein the first dielectric layer is 10 to 50 µm thick.

8. The glass-based antenna array package of claim 1, wherein the first dielectric layer is a low dielectric constant (k) polymer.

9. The glass-based antenna array package of claim 1, wherein the glass-based antenna array package does not include a second glass substrate layer encapsulating the at least one semiconductor device.

10. The glass-based antenna array package of claim 1, further comprising:
a second dielectric layer coupled to the first side of the glass substrate layer.

11. The glass-based antenna array package of claim 1, wherein the first dielectric layer comprises a plurality of dielectric layers.

12. The glass-based antenna array package of claim 1, wherein the one or more antennas comprise a plurality of antennas.

13. The glass-based antenna array package of claim 12, wherein the glass-based antenna array package comprises a millimeter-wave module, and wherein the plurality of antennas is integrated into the millimeter-wave module.

14. The glass-based antenna array package of claim 1, wherein the glass-based antenna array package comprises a Radio Frequency Integrated Circuit (RFIC) package.

15. A method of manufacturing a glass-based antenna array package, comprising:
providing a single glass substrate layer;
attaching one or more antennas to a first side of the glass substrate layer;
attaching at least one semiconductor device to a second side of the glass substrate layer;
adhering a first surface of a first dielectric layer to the second side of the glass substrate layer, the first dielectric layer encapsulating the at least one semiconductor device; and
forming a redistribution layer on a second surface of the first dielectric layer, the redistribution layer conductively coupling the at least one semiconductor device to the one or more antennas.

16. The method of claim 15, further comprising:
forming one or more vias through the glass substrate layer to conductively couple the at least one semiconductor device to the one or more antennas.

17. The method of claim 15, further comprising:
conductively coupling a plurality of package balls to the first dielectric layer.

18. The method of claim 15, further comprising:
attaching a second semiconductor device to the second side of the glass substrate layer, wherein the first dielectric layer encapsulates the second semiconductor device.

19. The method of claim 15, further comprising:
surface mounting a passive device to the second side of the glass substrate layer, wherein the first dielectric layer encapsulates the passive device.

20. The method of claim 15, wherein the glass substrate layer is at least approximately 100 µm thick.

21. The method of claim 15, wherein the first dielectric layer is 10 to 50 µm thick.

22. The method of claim 15, wherein the first dielectric layer is a low dielectric constant (k) polymer.

23. The method of claim 15, wherein the glass-based antenna array package does not include a second glass substrate layer encapsulating the at least one semiconductor device.

24. The method of claim 15, further comprising:
layering a second dielectric layer on the first side of the glass substrate layer.

25. The method of claim 15, wherein the first dielectric layer comprises a plurality of dielectric layers.

26. The method of claim 15, wherein the one or more antennas comprise a plurality of antennas.

27. The method of claim 26, wherein the glass-based antenna array package comprises a millimeter-wave module, and wherein the plurality of antennas is integrated into the millimeter-wave module.

28. The method of claim 15, wherein the glass-based antenna array package comprises a Radio Frequency Integrated Circuit (RFIC) package.

29. A glass-based antenna array package, comprising:
a single glass substrate layer;
one or more antennas attached to a first side of the glass substrate layer;
at least one means for processing attached to a second side of the glass substrate layer;

a means for insulating having a first surface adhered to the second side of the glass substrate layer, the means for insulating encapsulating the at least one means for processing; and a redistribution layer on a second surface of the means for insulating, the redistribution layer conductively coupling the at least one means for processing to the one or more antennas.

30. A non-transitory computer-readable medium storing computer-executable instructions for manufacturing a glass-based antenna array package, the computer-executable instructions comprising:

at least one instruction instructing a machine to provide a single glass substrate layer;

at least one instruction instructing a machine to attach one or more antennas to a first side of the glass substrate layer;

at least one instruction instructing a machine to attach at least one semiconductor device to a second side of the glass substrate layer;

at least one instruction instructing a machine to adhere a first surface of a dielectric layer to the second side of the glass substrate layer, the dielectric layer encapsulating the at least one semiconductor device; and at least one instruction instructing a machine to form a redistribution layer on a second surface of the first dielectric layer, the redistribution layer conductively coupling the at least one semiconductor device to the one or more antennas.

* * * * *